(12) United States Patent
McConnell

(10) Patent No.: US 10,297,333 B2
(45) Date of Patent: May 21, 2019

(54) DRYING SYSTEM AND METHOD

(71) Applicant: Steven McConnell, Charlotte, NC (US)

(72) Inventor: Steven McConnell, Charlotte, NC (US)

( * ) Notice: Subject to any disclaimer, the term of this patent is extended or adjusted under 35 U.S.C. 154(b) by 301 days.

(21) Appl. No.: 15/284,313

(22) Filed: Oct. 3, 2016

(65) Prior Publication Data

US 2017/0292786 A1    Oct. 12, 2017

Related U.S. Application Data

(60) Provisional application No. 62/320,377, filed on Apr. 8, 2016.

(51) Int. Cl.

| *A47G 23/03* | (2006.01) |
|---|---|
| *A47L 19/00* | (2006.01) |
| *A47L 19/02* | (2006.01) |
| *A47L 19/04* | (2006.01) |
| *G11C 29/38* | (2006.01) |
| *F26B 5/16* | (2006.01) |
| *G11C 11/56* | (2006.01) |
| *G11C 29/44* | (2006.01) |
| *G11C 29/00* | (2006.01) |
| *G11C 16/34* | (2006.01) |

(52) U.S. Cl.
CPC .............. *G11C 29/38* (2013.01); *A47G 23/03* (2013.01); *A47L 19/00* (2013.01); *A47L 19/02* (2013.01); *A47L 19/04* (2013.01); *F26B 5/16* (2013.01); *G11C 11/5628* (2013.01); *G11C 11/5642* (2013.01); *G11C 29/44* (2013.01); *G11C 29/76* (2013.01); *G11C 16/349* (2013.01)

(58) Field of Classification Search
CPC .......... A47L 19/00; A47L 19/04; A47L 19/02; A47L 15/50; A47L 15/503; F26B 5/16; A47B 81/04; A47B 77/06; A47G 23/03; A47G 23/0303; A47G 23/032; B65D 81/26; A47J 47/16; A47J 47/20
USPC ........ 211/41.3, 41.6, 85.3, 195; 34/95, 95.3; 5/420, 925, 417; 4/581, 582; 220/572; 428/221
See application file for complete search history.

(56) References Cited

U.S. PATENT DOCUMENTS

| 539,698 A * | 5/1895 | Milligan ................ A47G 23/03 248/346.11 |
|---|---|---|
| 1,387,239 A * | 8/1921 | Chandler ........... A47G 23/0303 428/104 |
| 1,661,987 A * | 3/1928 | Arnopol ................ A47G 23/03 428/102 |
| 1,852,323 A * | 4/1932 | Long ..................... A47G 23/03 160/231.1 |
| 1,944,686 A * | 1/1934 | Gershon ................ A47G 23/03 112/423 |

(Continued)

*Primary Examiner* — Jennifer E. Novosad
(74) *Attorney, Agent, or Firm* — Integrity Patent Group, PLC; Charles E. Runyan

(57) ABSTRACT

A drying system having a wicking member defined by a top-surface, a bottom-surface, and a thickness; wherein the drying system for items includes the wicking member suitable for supporting the items for drying in an ambient environment. The bottom-surface is able to be placed on a planar-surface (such as a table or counter or the like) to support the wicking member, the bottom-surface adjacent the planar-surface when used. The wicking member has pleated vertical members protruding upwardly from the top-surface. The wicking member may be made of terry cloth or other suitable fabric that is flexible.

18 Claims, 5 Drawing Sheets

(56) References Cited

U.S. PATENT DOCUMENTS

| | | | | |
|---|---|---|---|---|
| 1,956,572 A * | 5/1934 | Grossen | A47G 23/03 | 229/103 |
| 2,025,926 A * | 12/1935 | Winter | A47G 23/0303 | 160/230 |
| 2,374,156 A * | 4/1945 | Wellman | A47G 23/03 | 160/229.1 |
| 2,512,310 A * | 6/1950 | Corson | A47G 27/0231 | 15/215 |
| 2,805,514 A * | 9/1957 | Cobin | A47G 23/0303 | 112/423 |
| 2,809,145 A * | 10/1957 | McDermott | B41J 29/08 | 156/220 |
| 3,666,604 A * | 5/1972 | Coffett | A47G 23/0303 | 428/81 |
| 4,137,356 A * | 1/1979 | Shoemaker | A47G 23/0303 | 248/346.11 |
| 4,234,973 A * | 11/1980 | Vetter | E04H 4/082 | 108/68 |
| 4,953,823 A * | 9/1990 | Sheaffer | A47G 23/032 | 215/394 |
| 4,958,577 A * | 9/1990 | Demaio | A47B 23/002 | 108/166 |
| 5,047,267 A * | 9/1991 | Pantaleo | A47G 23/0303 | 40/426 |
| 5,467,487 A * | 11/1995 | Sicard | A45C 3/10 | 190/2 |
| 5,704,492 A * | 1/1998 | Bartko | A47J 47/20 | 211/41.3 |
| 5,740,567 A * | 4/1998 | Mitchell | A47G 9/062 | 4/582 |
| 5,829,627 A * | 11/1998 | Martindale | A47G 23/0303 | 220/666 |
| 5,956,798 A * | 9/1999 | Nemoto | A47L 13/40 | 15/1.51 |
| 5,964,161 A * | 10/1999 | Conway | B60N 3/002 | 108/43 |
| D418,647 S * | 1/2000 | Snell | D32/55 | |
| 6,419,988 B1 * | 7/2002 | Sovell | A47G 7/02 | 427/322 |
| 6,763,954 B1 * | 7/2004 | Travers | A47L 19/02 | 211/41.3 |
| 6,770,581 B1 * | 8/2004 | DeMott | A47G 23/03 | 428/91 |
| 6,961,969 B2 | 11/2005 | Nichols | | |
| D540,095 S * | 4/2007 | Lee | D6/583 | |
| 7,625,625 B2 * | 12/2009 | Rios | A43B 13/22 | 428/141 |
| D615,266 S * | 5/2010 | Lion | D32/57 | |
| 7,726,260 B1 * | 6/2010 | Yananton | A47L 19/02 | 119/171 |
| D659,458 S * | 5/2012 | Lerman | D6/585 | |
| 9,032,567 B1 * | 5/2015 | Galgano | A47J 47/20 | 4/657 |
| D747,583 S * | 1/2016 | Wilmsen | D32/55 | |
| 9,730,571 B1 * | 8/2017 | Lee | A47L 19/04 | |
| 9,873,963 B2 * | 1/2018 | Scorgie | B32B 5/028 | |
| 2004/0231084 A1 | 11/2004 | McKenzie | | |
| 2006/0060522 A1 * | 3/2006 | Bushey | A47J 43/24 | 210/470 |
| 2009/0038174 A1 | 2/2009 | Hoffman-Lubitch | | |
| 2009/0162596 A1 | 6/2009 | Rios | | |
| 2010/0064948 A1 * | 3/2010 | Tucker | A47B 97/00 | 108/161 |
| 2010/0143640 A1 * | 6/2010 | Wilmsen | A47G 27/0225 | 428/85 |
| 2010/0143645 A1 | 6/2010 | Wilmsen | | |
| 2010/0297423 A1 * | 11/2010 | Chapman | B32B 3/10 | 428/304.4 |
| 2011/0143083 A1 * | 6/2011 | Scorgie | A47G 27/0225 | 428/95 |
| 2012/0208416 A1 * | 8/2012 | Lerman | B32B 5/028 | 442/1 |
| 2012/0228252 A1 * | 9/2012 | Gossens | A47B 73/00 | 211/134 |
| 2013/0216755 A1 * | 8/2013 | Adimey | A47G 21/167 | 428/43 |
| 2013/0227855 A1 | 9/2013 | Wilmsen | | |
| 2014/0263111 A1 * | 9/2014 | Micek | A47L 19/04 | 211/41.6 |
| 2016/0160485 A1 * | 6/2016 | Bomatter | A47J 47/20 | 4/657 |
| 2016/0206176 A1 * | 7/2016 | Eilmus | A47L 19/04 | |
| 2017/0231465 A1 * | 8/2017 | Wilmsen | A47L 19/00 | 34/329 |
| 2017/0292786 A1 * | 10/2017 | McConnell | F26B 5/16 | |

\* cited by examiner

DRYING SYSTEM AND METHOD

CROSS-REFERENCE TO RELATED APPLICATION

The present application is related to and claims priority from prior provisional application Ser. No. 62/370,377, filed Aug. 3, 2016 which application is incorporated herein by reference.

BACKGROUND OF THE INVENTION

The following includes information that may be useful in understanding the present invention(s). It is not an admission that any of the information provided herein is prior art, or material, to the presently described or claimed inventions, or that any publication or document that is specifically or implicitly referenced is prior art.

1. Field of the Invention

The present invention relates generally to the field of drying means and more specifically relates to a drying system.

2. Description of Related Art

A towel is a piece of absorbent fabric or paper used for drying or wiping a body or a surface. It draws moisture through direct contact, often using a blotting or a rubbing motion. In households, several types of fabric towels are used, including hand towels (small towels placed by a sink for drying the hands), bath towels (large towels for drying the hair and body after a bath or shower) and kitchen towels, which are used for hand drying dishes.

After handwashing dishes, many individuals use a plastic dish drainer to dry dishes. These drainers tend to be cumbersome and unattractive and take up valuable kitchen space. In addition, they can become moldy because they often stay wet for prolonged periods of time. Ordinary dishtowels and dish mats do not prop up kitchenware and therefore do not allow the items to completely dry inside because they trap moisture. This can lead to individuals having to hand dry each item. A more effective alternative is needed.

Several attempts have been made to solve the above-mentioned problems such as those found in U.S. Pat. and Pub. Nos. 6,961,969; 2013/0227855; 2009/0038174; 2010/0143645; 2009/0162596; and 2004/0231084. This art is representative of drying means. However, none of the above inventions and patents, taken either singly or in combination, is seen to describe the invention as claimed.

BRIEF SUMMARY OF THE INVENTION

In view of the foregoing disadvantages inherent in the known drying means art, the present invention provides a novel drying system. The general purpose of the present invention, which will be described subsequently in greater detail is to provide an efficient means for drying kitchenware or the like.

A drying system for items is disclosed herein, in a preferred embodiment, comprising: a wicking member defined by a top-surface, a bottom-surface, and a thickness; wherein the drying system for items comprises the wicking member suitable for supporting the items for drying in an ambient environment.

The bottom-surface is able to be placed on a planar-surface (such as a table or counter or the like) to support the wicking member; the bottom-surface adjacent the planar-surface when used. The wicking member comprises pleated vertical members protruding upwardly from the top-surface. The wicking member may comprise terry cloth or other suitable fabric that is flexible and able to wick moisture.

The pleated vertical members are configured to support the items in a favorable drying position with a maximum surface area of the items exposed to the ambient environment and the thickness of the wicking member being able to wick and absorb moisture from the items while drying. The top-surface and the bottom-surface are joined integrally via the thickness; wherein the pleated vertical members are bunched (preferably sewn-secured), and run a length of the wicking member. In preferred embodiments the pleated vertical member(s) each run parallel to another of the pleated vertical member(s); wherein the pleated vertical member(s) comprise a minimum height of at least ¼ inch and a maximum height of ½ inch (other dimensions may be used). The pleated vertical member(s) are preferably formed 2¼ inches apart to support the item vertically. The wicking member, as such, may comprise a one-piece construction in preferred embodiments formed from a single towel or the like). The drying system for items is useful for placing the items thereon to promote drying.

A method of using a drying system for items is disclosed herein comprising the steps of: setting the item on a top-surface resting on at least one pleated vertical members such that the item is supported for drying, and removing the item once drying is completed.

The present invention holds significant improvements and serves as a drying system. Preferably, a drying means should provide efficient means for drying any hand-washed items such as toolware, dishware, kitchenware or the like and, yet would operate reliably and be manufactured at a modest expense. Thus, a need exists for a reliable drying system to avoid the above-mentioned problems.

For purposes of summarizing the invention, certain aspects, advantages, and novel features of the invention have been described herein. It is to be understood that not necessarily all such advantages may be achieved in accordance with any one particular embodiment of the invention. Thus, the invention may be embodied or carried out in a manner that achieves or optimizes one advantage or group of advantages as taught herein without necessarily achieving other advantages as may be taught or suggested herein. The features of the invention which are believed to be novel are particularly pointed out and distinctly claimed in the concluding portion of the specification. These and other features, aspects, and advantages of the present invention will become better understood with reference to the following drawings and detailed description.

BRIEF DESCRIPTION OF THE DRAWINGS

The figures which accompany the written portion of this specification illustrate embodiments and method(s) of use for the present disclosure, drying system, constructed and operative according to the teachings of the present disclosure.

The various embodiments of the present invention will hereinafter be described in conjunction with the appended drawings, wherein like designations denote like elements.

DETAILED DESCRIPTION

As discussed above, embodiments of the present disclosure relate to a drying means and more particularly to a drying system as used to improve the efficiency of drying kitchenware or the like.

Generally speaking, in preferred embodiments, the drying system is a rectangular knit fabric towel with machine sewn fabric rows spaced across the towel to form raised pleats. The size of the towel may vary and the pleats may vary in size from ¼" tall to ½" tall. The towel may contain four pleated rows depending on its size. The first two rows of pleats may be about 2¼" apart to accommodate holding up spoons and small forks. The second two rows of pleats may be spaced about 2½" apart to accommodate holding up large forks. All other kitchenware items may be propped up anywhere space is available. The towel may be available in a variety of colors, designs and fabric styles.

The drying system enables wet dishes, pots, bottles, mugs, and the like to be placed upside down on a tilt to dry. This provides a convenient and sanitary location for drying dishes. It allows individuals to dry items that have been hand washed more quickly or to efficiently dry items that are removed from the dishwasher. It affords an attractive alternative to other dish drying devices that take up valuable counter space. The drying system replaces the need for conventional dish towels and dish mats that do not have raised pleats to assist in complete drying.

Figure 1:
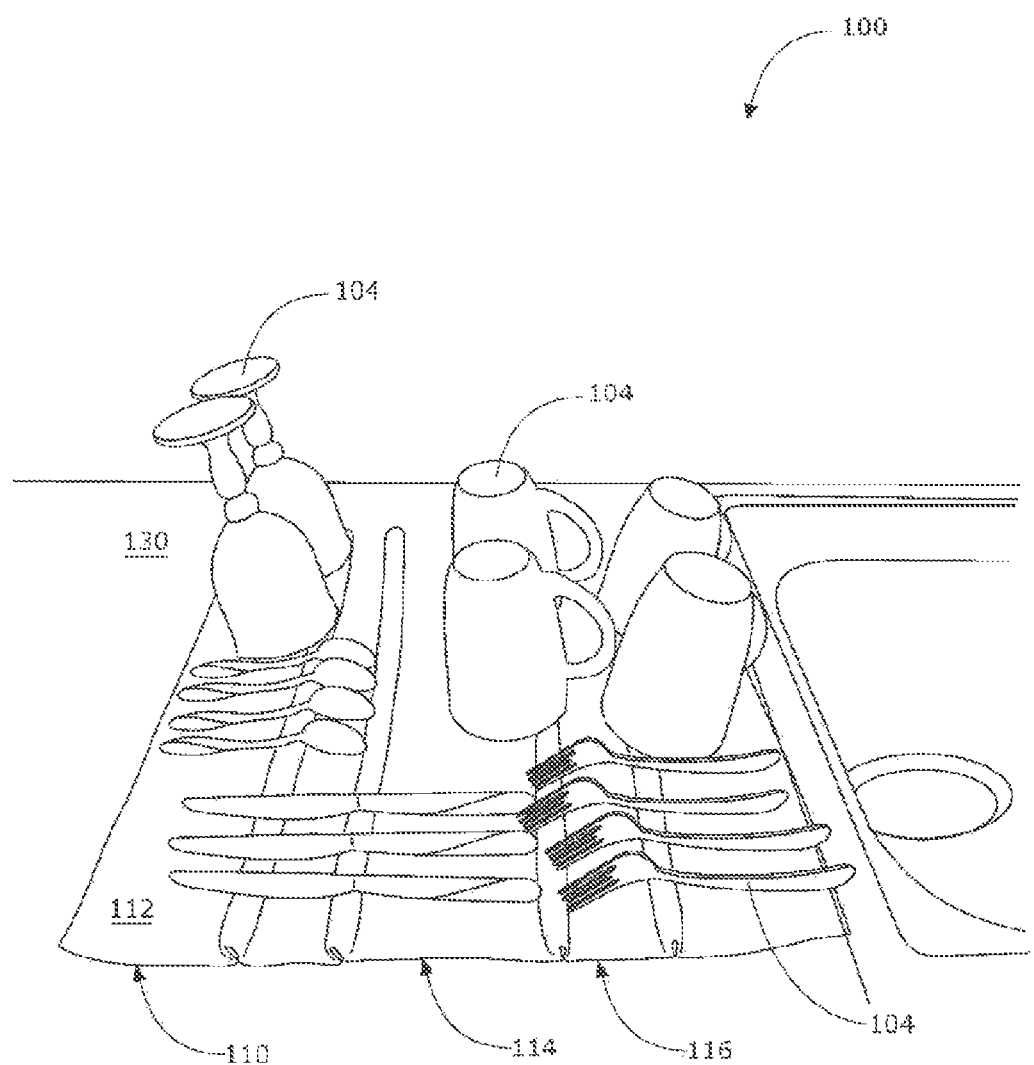
FIG. 1 shows a perspective view illustrating a drying system during an 'in-use' condition according to an embodiment of the disclosure.

Referring now more specifically to the drawings by numerals of reference there is shown in FIGS. 1-4, various views of drying system 100 for items 104 comprising: wicking member 110 defined by top-surface 112, bottom-surface 114, and thickness 116; wherein drying system 100 for items 104 comprises wicking member 110 suitable for supporting items 104 for drying in an ambient environment. Referring now to bottom-surface 114; bottom-surface 114 is able to be placed on a planar-surface 130 to support wicking member 110; bottom-surface 114 adjacent planar-surface 130 when used, as shown in FIG. 1.

Figure 2:
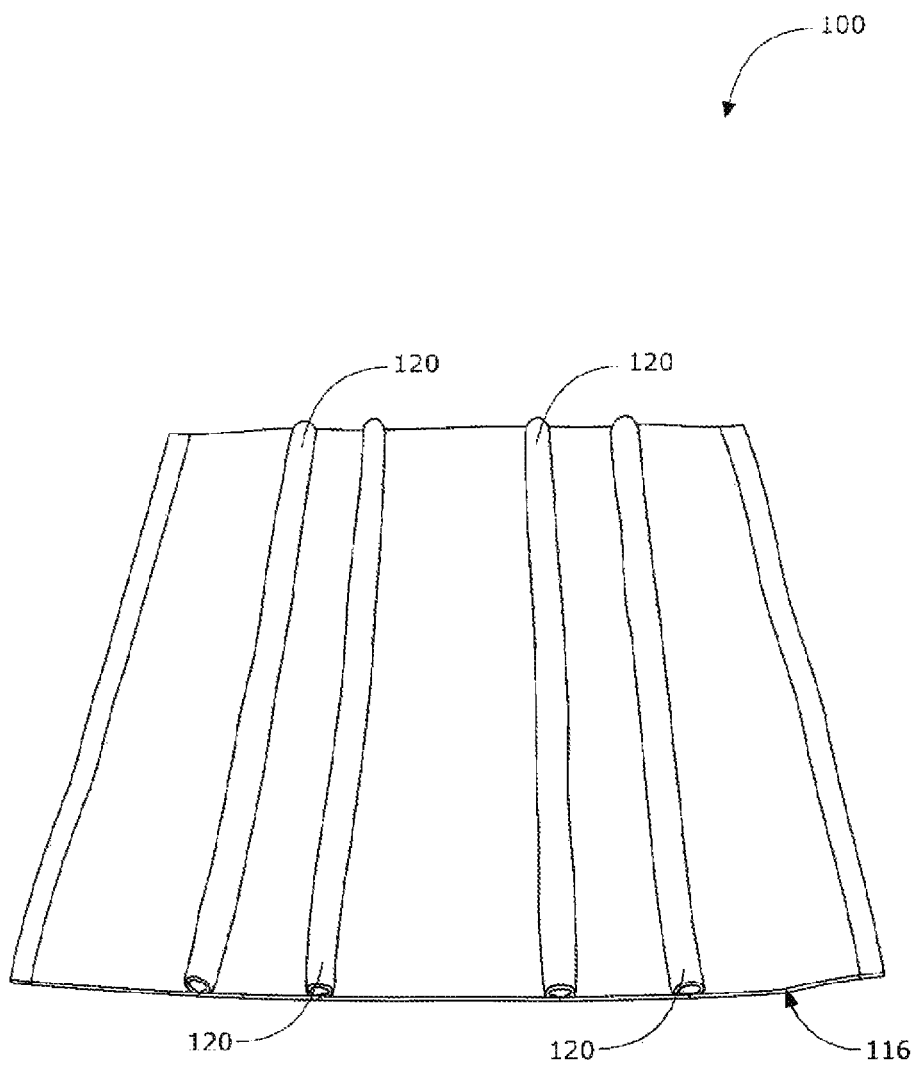
FIG. 2 is a perspective view illustrating the drying system comprising a wicking member according to an embodiment of the present invention of the disclosure.

Referring now to wicking member 110; wicking member 110 comprises pleated vertical members 120 protruding upwardly from top-surface 112; wherein the pleated vertical members 120 are configured to support the items 104 in a favorable drying position with a maximum surface area of the items 104 exposed to the ambient environment and the thickness 116 of the wicking member 110 being able to wick and absorb moisture from the items 104 while drying. Top-surface 112 and the bottom-surface 114 are joined integrally via the thickness 116, and as such the drying system 100 for items 104 is useful for placing the items 104 thereon to promote the drying, as shown in FIG. 2. The wicking member 110 may comprise terry cloth or other suitable absorbent fabric.

Figure 3:
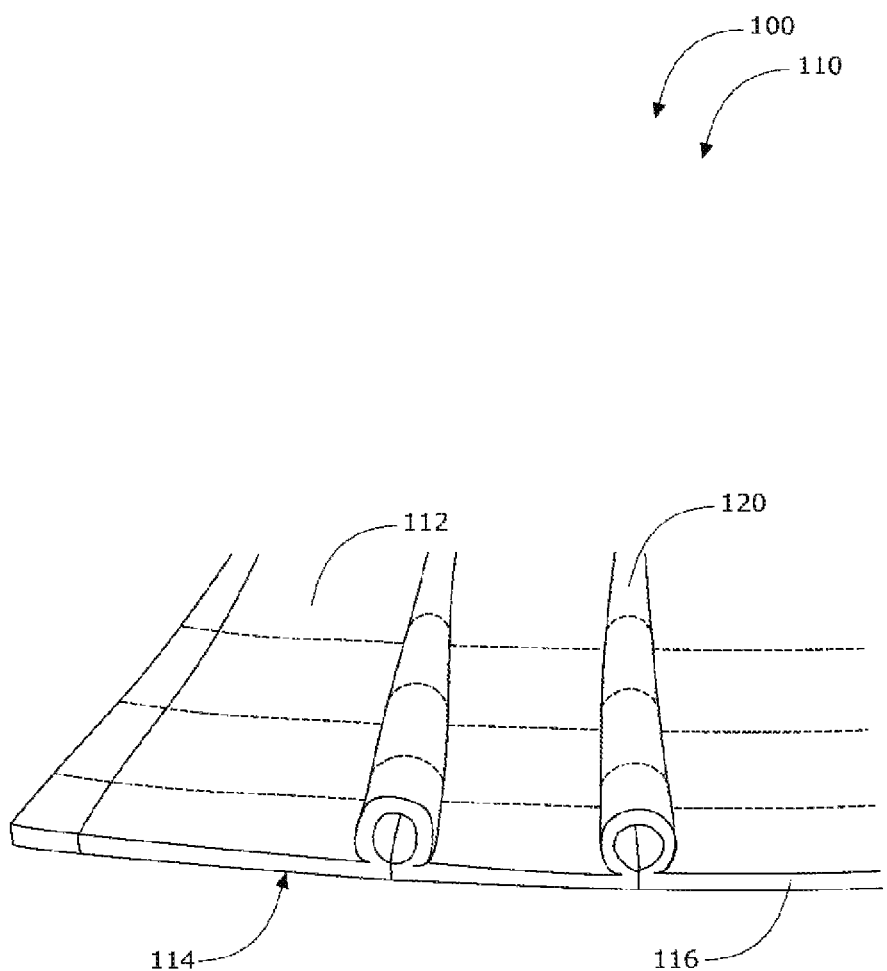
FIG. 3 is a perspective view illustrating the wicking member having pleated vertical members according to an embodiment of the present disclosure.

Referring now to the pleated vertical members 120; pleated vertical members 120 are bunched; pleated vertical members 120 are preferably sewn-secured; pleated vertical members 120 run a length of the wicking member 120. Pleated vertical member(s) 120 each preferably run parallel to another of the pleated vertical member(s) 120. Pleated vertical member(s) 120 comprise a minimum height of at least ¼ inch; pleated vertical member(s) 120 comprise a maximum height 125 of ½ inch in preferred embodiments. Pleated vertical member(s) 120 are formed 2¼a inches apart to support the item 104 vertically, as shown in FIG. 3.

Figure 4:
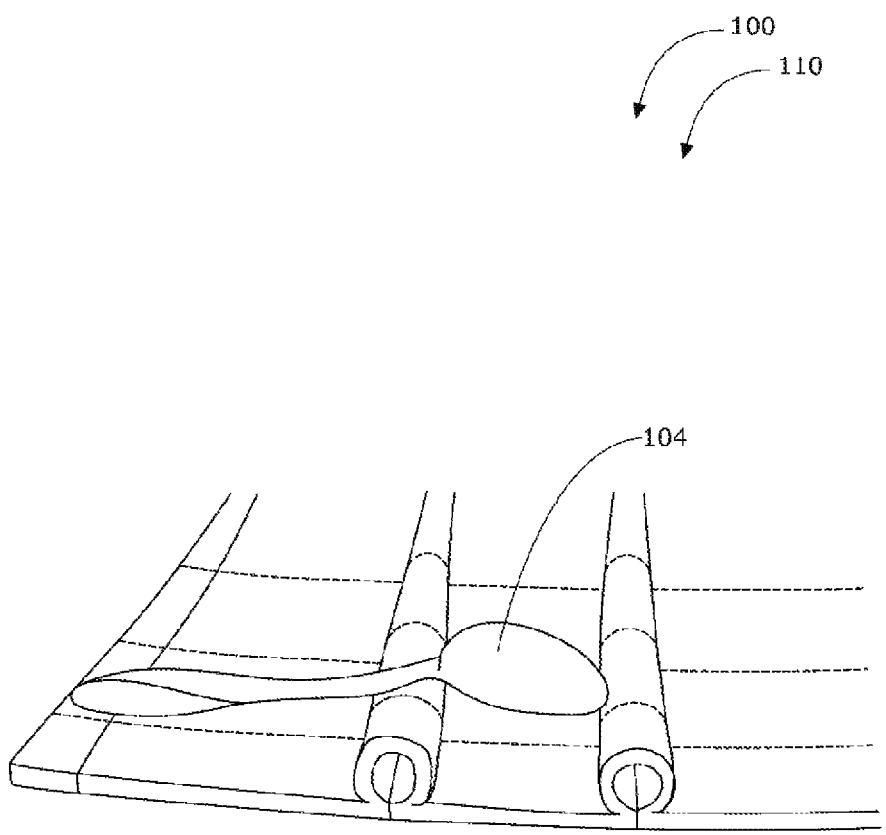
FIG. 4 is a side view illustrating the pleated vertical members according to an embodiment of the present disclosure.

Referring now to the item 104; item 104 comprises a utensil; item 104 comprises at least one dishware; item 104 comprises at least one kitchenware as shown in FIG. 4. Other items may be dried.

Referring now to the wicking member 110 which comprises a one-piece construction; in some embodiments wicking member 110 does not comprise a one-piece construction; wicking member 110 comprises a towel with functional support ribs.

Figure 5:
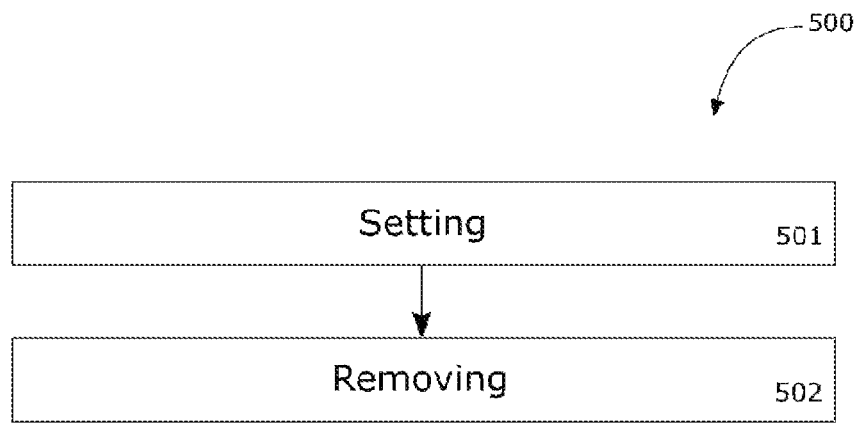
FIG. 5 is a flow diagram illustrating a method of use for the drying system according to an embodiment of the present disclosure.

Referring now to FIG. 5 showing a flow diagram 550 illustrating method of use 500 for drying system 100 according to an embodiment of the present invention of FIGS. 1-4. As shown, method of use 500 may comprise the steps of: step one 501, setting the item on a top-surface resting on at least one pleated vertical members such that the item is supported for drying; step two 502, removing the item once drying is completed.

It should be noted that the steps described in the method of use can be carried out in many different orders according to user preference. The use of "step of" should not be interpreted as "step for", in the claims herein and is not intended to invoke the provisions of 35 U.S.C. § 112 (f). Upon reading this specification, it should be appreciated that, under appropriate circumstances, considering such issues as design preference, user preferences, marketing preferences, cost, structural requirements, available materials, technological advances, etc., other methods of use arrangements such as, for example, different orders within above-mentioned list, elimination or addition of certain steps, including or excluding certain maintenance steps, etc., may be sufficient.

The drying system is not intended to be exhaustive or to be limited by the precise forms disclosed, and obviously many modifications and variations are possible in light of the above teaching. The exemplary embodiment was chosen and described in order to best explain the principles of the present invention and its practical application, to thereby enable others skilled in the art to best utilize the present invention and various embodiments with various modifications as are suited to the particular use contemplated.

The embodiments of the invention described herein are exemplary and numerous modifications, variations and rearrangements can be readily envisioned to achieve substantially equivalent results, all of which are intended to be embraced within the spirit and scope of the invention. Further, the purpose of the foregoing abstract is to enable the U.S. Patent and Trademark Office and the public generally, and especially the scientist, engineers and practitioners in the art who are not familiar with patent or legal terms or phraseology, to determine quickly from a cursory inspection the nature and essence of the technical disclosure of the application.

What is claimed is new and desired to be protected by Letters Patent is set forth in the appended claims:

1. A drying system for items comprising:
   a wicking member defined by, a top-surface,
a bottom-surface,
and a thickness,
wherein said drying system for items comprises said wicking member suitable for supporting said items for drying in an ambient environment,
wherein said bottom-surface is able to be placed on a planar-surface to support said wicking member, said bottom-surface adjacent said planar-surface when used,
wherein said wicking member comprises pleated vertical members protruding upwardly from said top-surface,
wherein said pleated vertical members are configured to support said items in a drying position with a maximum surface area of said items exposed to said ambient environment and at least partially lifted above the top surface and said thickness of said wicking member being able to wick and absorb moisture from said items while drying,
wherein said top-surface and said bottom-surface are joined integrally via said thickness, and
wherein said drying system for items is useful for placing said items thereon to promote said drying.

2. The drying system for items of claim 1 wherein said wicking member comprises terry cloth.

3. The drying system for items of claim 2 wherein said pleated vertical members are bunched.

4. The drying system for items of claim 3 wherein said pleated vertical members are sewn-secured.

5. The drying system for items of claim 1 wherein said wicking member comprises absorbent fabric.

6. The drying system for items of claim 1 wherein said pleated vertical members run a length of said wicking member.

7. The drying system for items of claim 6 wherein said pleated vertical members each run parallel to another of said pleated vertical members.

8. The drying system for items of claim 7 wherein said pleated vertical members comprise a minimum height of at least ¼ inch.

9. The drying system for items of claim 7 wherein said pleated vertical members comprise a maximum height of ½ inch.

10. The drying system for items of claim 7 wherein said pleated vertical members are formed 2¼ inches apart to support said item vertically.

11. The drying system for items of claim 1 wherein said wicking member comprises a one-piece construction.

12. The drying system for items of claim 1 wherein said wicking member does not comprise a one-piece construction.

13. The drying system for items of claim 12 wherein said wicking member comprises a towel with functional support ribs.

14. A drying system for items comprising:
a wicking member defined
by, a top-surface,
a bottom-surface,
and a thickness,
wherein said drying system for items comprises said wicking member suitable for supporting said items for drying in an ambient environment,
wherein said bottom-surface is able to be placed on a planar-surface to support said wicking member, said bottom-surface adjacent said planar-surface when used,
wherein said wicking member comprises pleated vertical members protruding upwardly from said top-surface,
wherein said wicking member comprises terry cloth,
wherein said pleated vertical members are configured to support said items in a drying position with a maximum surface area of said items exposed to said ambient environment and said thickness of said wicking member being able to wick and absorb moisture from said items while drying,
wherein said top-surface and said bottom-surface are joined integrally via said thickness,
wherein said pleated vertical members are bunched,
wherein said pleated vertical members are sewn-secured,
wherein said pleated vertical members run a length of said wicking member,
wherein said pleated vertical members each run parallel to another of said pleated vertical members,
wherein said pleated vertical members comprise a minimum height of at least ¼ inch,
wherein said pleated vertical members comprise a maximum height of ½ inch,
wherein said pleated vertical members are formed 2¼ a inches apart to support said item vertically,
wherein said wicking member comprises a one-piece construction, and
wherein said drying system for items is useful for placing said items thereon to promote said drying.

15. A method of using a drying system for items comprising the steps of:
providing a wicking member defined by: a top-surface, a bottom-surface, and a thickness;
wherein said wicking member comprises pleated vertical members protruding upwardly from said top-surface,
placing said bottom-surface on a planar-surface to support said wicking member with said bottom-surface adjacent to said planar-surface when used,
setting said item on the top-surface resting on at least one of the pleated vertical members such that said item is at least partially lifted above the top surface and is supported for drying, and
removing said item once drying is completed.

16. The method of claim 15 wherein said item comprises a utensil.

17. The method of claim 15 wherein said item comprises at least one dishware.

18. The method of claim 15 wherein said item comprises at least one kitchenware.

* * * * *